United States Patent [19]
Ouellet et al.

[11] Patent Number: 5,935,395
[45] Date of Patent: Aug. 10, 1999

[54] SUBSTRATE PROCESSING APPARATUS WITH NON-EVAPORABLE GETTER PUMP

[75] Inventors: Luc Ouellet, Granby; Yves Tremblay, Bromont; Luc Gendron, Canton de Shefford, all of Canada

[73] Assignee: Mitel Corporation, Kanata, Canada

[21] Appl. No.: 08/666,256

[22] Filed: Jun. 20, 1996

Related U.S. Application Data

[63] Continuation-in-part of application No. 08/562,575, Nov. 24, 1995, abandoned, which is a continuation-in-part of application No. 08/555,325, Nov. 8, 1995, abandoned.

[51] Int. Cl.⁶ ............................. C23C 14/34; C23C 16/00
[52] U.S. Cl. ........................ 204/298.07; 204/298.25; 204/298.33; 204/298.09; 204/298.11; 118/715; 118/719; 118/724; 156/345; 417/51
[58] Field of Search .................. 204/298.07, 298.09, 204/298.11, 298.25, 298.32, 298.33; 118/715, 724, 723 E, 719; 156/345; 417/48, 51

[56] References Cited

U.S. PATENT DOCUMENTS

| | | | |
|---|---|---|---|
| 3,892,650 | 7/1975 | Cuomo et al. | 204/192.15 |
| 4,137,012 | 1/1979 | Della Porta et al. | 417/51 |
| 4,465,416 | 8/1984 | Burkhalter et al. | 204/298.25 |
| 5,286,296 | 2/1994 | Sato et al. | 118/719 |
| 5,357,760 | 10/1994 | Higham | 62/55.5 |
| 5,589,224 | 12/1996 | Tepman et al. | 118/715 |
| 5,685,963 | 11/1997 | Lorimer et al. | 204/298.03 |

FOREIGN PATENT DOCUMENTS

| | | |
|---|---|---|
| 0 693 626 | 1/1996 | European Pat. Off. . |
| 1 011 996 | 7/1957 | Germany . |
| 58-117372 | 7/1983 | Japan . |
| 1200071 | 11/1989 | Japan . |
| 7233785 | 5/1995 | Japan . |
| 2 077 487 | 12/1981 | United Kingdom . |
| 96/13620 | 5/1996 | WIPO . |
| WO 96/17171 | 6/1996 | WIPO . |

OTHER PUBLICATIONS

Briesacher et al., "Non–Evaporable Getter Pumps for Semiconductor Processing Equipment," Department of Electronics, Faculty of Engineering, Tohoku University, vol. 1, No. 1, pp. 49–57, 1990.

Lorimer et al., "enhanced UHV Performances with Zirconium–Based Getter," Solid State Technology, pp. 77–80, Sep. 1990.

Briesacher et al. "Non–Evaporable Getter Pumps For Semiconductor Processing Equipment" 1990—Department of Electronics Faculty of Engineering, Tohoku University. vol. 1, No. 11, pp. 49–55.

Lorimar et al., "Enhanced UHV Performance With Zirconium–Based Getter", Solid State Technology, pp. 77–80 –Sep. 1990.

SAES Getters –SORB–AC Getter Wafer Modules and Panels.

SAES Getters –St 101 Non–Evaporable Getters.

SAES Getters –SAES Getters Group Bulletin –Mar. '93 No. 3.

SORB–AC Appendage Getter Pumps –SAES Getters.

SAES Vacuum Gauge –Wide Range Spinning Rotor Gauge.

Capacitorr –New High Capacity Non–Evaporable Getter Pump.

*Primary Examiner*—Nam Nguyen
*Assistant Examiner*—Rodney G. McDonald
*Attorney, Agent, or Firm*—Marks & Clerk

[57] ABSTRACT

An apparatus for processing a substrate includes at least one closed chamber for containing the substrate in a controlled environment, and a non-evaporable gettering material in the chamber acting as an internal pump serving as the primary pumping means for removing contaminants from the controlled environment. In this way the use of expensive and bulky cryogenic pumps can be avoided or minimized.

28 Claims, 3 Drawing Sheets

SUBSTRATE PROCESSING APPARATUS WITH NON-EVAPORABLE GETTER PUMP

This is a continuation-in-part of our application Ser. No. 08/562,575 filed on Nov. 24, 1995 now abandoned, which in turn is a continuation-in-part of our application Ser. No. 08/555,325 filed on Nov. 8, 1995 now abandoned.

BACKGROUND OF THE INVENTION

This invention relates to a method and apparatus for processing a substrate, for example, for carrying out vapor deposition, wafer transfer, or other processes on a semiconductor substrate.

Chemical (CVD) or physical (PVD) vapor deposition is usually carried out using a cluster tool. Such a tool is typically of modular design and comprises degas stations, which permit the removal of gases from the silicon wafers being processed; transfer modules, which isolate the various process modules and allow transfer of the wafers therebetween; etch process modules, which use inert gases to sputter clean oxides; physical vapor deposition (PVD) process modules, which use inert gases to sputter deposit various compounds, such as thin films; reactive PVD process modules, which use mixtures of inert gases and reactive gases in order to reactively sputter deposit various compounds, as thin films; chemical vapor deposition (CVD) process modules, which use relatively low vapor pressure reactive gases in order to reactively deposit various compounds, as thin films, via a chemical reaction at low pressure; and load locks, which isolate the internal components of the cluster tools from the ambient air.

Examples of commercially available cluster tools are Varian's M2000/8 and M2i (California, USA), Applied Materials' Endura HP (California, USA), Novellus' Concept Two Altus (California, USA), Materials Research Corporation's Eclipse Star and Galaxy (NY, USA), as well as Anelva's 1061 (Japan).

These cluster tools all use expensive vacuum load locks, special degas stations, expensive ultra high vacuum deposition modules, expensive dry pumps, large and expensive ultra-high vacuum cryogenic pumps, and special lamps and heaters. They require frequent regeneration and many other special components in order to obtain an ultra-high vacuum, to maintain ultra-high purity gas distribution and to prevent cross contamination.

Argon (or any other inert gas) may be used in the etch process modules and in the PVD process modules. A mixture of argon (or any other inert gas) and nitrogen (or any other reactive gas) is typically used in the reactive PVD process modules. Various chemicals are used in the CVD process modules.

The purity of the gases used in the PVD, reactive PVD and CVD process modules is very important in order to ensure controlled film properties. The gases used in the reactive PVD and CVD process modules constitute impurities for the etch and PVD process modules. Cross contamination between process modules must therefore be avoided and is the basic design consideration in current state of the art deposition cluster tools.

The carrying out of both CVD and PVD in the same cluster tool is particularly demanding of the equipment because of the difficulty in preventing cross contamination between the CVD and PVD processing modules. Very expensive large pumps are required to achieve the necessary pumping rates.

Deposition cluster tools use very large turbomolecular pumps or cryogenic pumps, complex gas distribution sequences, and have very long delays between the end of a process in a module and the opening of isolation valves of that module in order to prevent cross contamination between the various process modules.

Nitrogen, carbon monoxide, water vapor and hydrogen are some of the impurities that must be removed from argon (or from any other inert gas) before during, and after the etch or the PVD. As a result, expensive vacuum load locks are used to create the vacuum and ensure that the transfer modules and the process modules are well isolated from air which contains the impurities. Special degas modules are used to remove any trace of such impurities from the wafers' porous materials.

Intensive ultra-high vacuum modules, almost all of which have metal vacuum seals, with vacuum baked O-rings, polished sealing surfaces (which eliminate the need for vacuum grease), and very high purity, very dense, and very expensive alumina ceramics are used to achieve ultra-high vacuum. Dry pumps in addition to very expensive ultra-high vacuum cryogenic pumps are used to achieve ultra-high vacuum. Special in-situ ultraviolet or in-situ infrared lamps with external heaters are used as bake-out devices in order to heat the walls of the module and to facilitate the liberation and the pumping of the adsorbed/absorbed moisture which results in the opening of the modules to ambient air for a few minutes.

The typical waiting time of 10 to 12 hours to achieve ultra-high vacuum represents a very important downtime and is limited by the liberation of the adsorbed/absorbed moisture and by the pumping speed of the cryogenic pumps. In situ plasmas are used to help in the liberation of the adsorbed/absorbed moisture. These plasmas cause the dissociation of moisture into hydrogen and oxygen and since hydrogen is difficult to pump with cryogenic pumps, there is a tendency to accumulate hydrogen as residual gas and to limit the base pressure of the module. This situation results in the need for a regeneration of the cryogenic pump in order to re-activate the coconut charcoal and the hydrogen pumping with the cryogenic pump. Although a long regeneration cycle, in the order of 3 to 4 hours, improves the situation, the hydrogen equilibrium pressure remains the limiting factor and controls the vacuum performance (i.e. base pressure) of the module.

Even these complex, expensive state of the art deposition cluster tools can still only deliver an imperfect vacuum performance, gas impurity and contamination control for more demanding applications such as aluminum plugs, which require high temperature diffusion of aluminum alloys to fill small diameter contacts and vias, as well as for mixed PVD/CVD applications.

The aluminum plug process carried out in such cluster tools is very unstable because the high temperature self-diffusion of aluminum alloys is highly affected by the residual impurity levels present. Problems observed are: the filling of contacts and vias of small diameter and high aspect ratio; the roughness of the top surface of self-diffused aluminum alloys; and the photolithography of the obtained aluminum alloys all become erratic because the control of the residual gaseous impurity levels is still too marginal. This undesirable situation is the result of the marginal pumping speed of the large and expensive cryogenic pumps.

Electromigration and stress voiding of the aluminum interconnects is very sensitive to trace levels of gaseous impurities. Existing deposition cluster tools are only marginally able to guarantee repeatable reliability of the interconnects. The marginal pumping speed of the expensive cryogenic pumps is at the root of the problem.

Integration of PVD and of CVD in one deposition cluster tool is difficult. The limited pumping speed of the cryogenic pumps makes the prevention of cross contamination from the low vapor pressure chemicals used in the CVD process modules difficult.

The vibration of the large cryogenic pumps, the frequent cycling of the process gases (which results in local turbulence and abrupt pressure surges), and the frequent opening and closing of isolation valves cause particle contamination in the deposited films.

These factors together result in a very expensive, very complex, and very sophisticated deposition cluster tool with a very extensive set of spare parts. Despite this, unscheduled downtime still results from the failure of these sophisticated components and from the failure of the associated sophisticated software. Scheduled downtime results from the waiting time needed to achieve ultra-high vacuum conditions and from the regeneration time of the various cryogenic pumps.

Sophisticated software is needed to control the sophisticated hardware. Furthermore, the necessarily very large system uses a lot of expensive clean room space.

Most of these problems are associated with the need for sophisticated hardware, which ensures that the following five requirements are met: isolation from ambient air, suitable wafer degassing, ultra-high vacuum, ultra-high purity gas delivery, and prevention of cross contamination.

An object of the invention is to alleviate the aforementioned problems.

SUMMARY OF THE INVENTION

According to the present invention there is provided an apparatus for processing a substrate, comprising at least one closed chamber for containing the substrate in a controlled environment, and an internal pump located in said at least one closed chamber acting as the primary pumping means for maintaining a vacuum and removing contaminants from the controlled environment during processing, the internal pump comprising a non-evaporable gettering material.

Gettering materials generally have the property that they will absorb traces of residual gases, such as the gases noted above. There are essentially two types of gettering material: evaporable and non-evaporable.

An evaporable material, such as titanium, must be vaporized in a vacuum chamber, and as it condenses onto the wall of the chamber, being in a highly activated state, it absorbs residual gases. Getter pumps employing such materials have been used in certain applications to periodically remove residual gases from vacuum chambers, but such evaporable materials cannot be used in cluster tools or similar semiconductor processing tools where there is an ongoing need to remove contaminant gases. The deposition of titanium in the chamber would destroy the equipment and workpiece.

Non-evaporable getters, known as NEGs were developed about 20 years ago. NEGs do not need to be vaporized. They can be activated by applying heat in a vacuum to drive off the thin protective layer formed at room temperature during air exposure. They then absorb contaminant gases and can be regenerated by re-applying heat in a vacuum. NEG has been used in large scale ultra-high purity gas purification systems or large scale ultra-high vacuum nuclear research facilities, such as CERN, Geneva, but not as a pumping material in a vacuum treatment chamber. NEGs once activated will absorb gaseous impurities, but they will not absorb inert gases, such as argon, which is commonly used in cluster tools. NEGS become effective at pressures below about $10^{-6}$–$10^{-7}$ Torr.

The pumping speed of non-evaporable gettering material (NEG) is such (as much as 30,000 liters per second) that cryogenic pumps or large scale turbomolecular pumps can be dispensed with entirely. In addition, NEG has the added advantage that it does not pump inert gases, such as argon, in which it may be desired to carry out the process.

It should be understood that turbomolecular pumps operate on the principle of transfer of momentum to the gas molecules from a high speed rotor, which directs then out through the discharge pipe. According to the kinetic theory of gases, the velocity of the gas molecules at a given temperature is dependent on their molecular weight. Thus, there is a relationship between the size of the pump on the one hand and the molecular weight of the gas and the vacuum to be attained on the other. A relatively small sized turbomolecular pump is capable of attaining a vacuum of about $10^{-6}$–$10^{-7}$ Torr for both light gases, such as hydrogen and heavy gases, such as argon. However, in order to reduce the pressure below this level for light gases, (and thus achieve ultra low absolute pressures) very high speed, and thus large, turbomolecular pumps are required. However, pumps of modest size can attain pressures or partial pressures of about $10^{-9}$ Torr for argon because of its high molecular weight.

In accordance with the invention, it is only necessary, initially, to attain an absolute pressure of about $10^{-7}$ Torr. This is the pressure needed to allow the NEG material to become effective. This pressure can be achieved with a relatively small turbomolecular pump, which would be incapable of attaining pressures in the region of $10^{-9}$ except for pure argon. Such a pump would not be able to remove light contaminants, such as hydrogen below a partial pressure for hydrogen of about $10^{-7}$ Torr.

Once the pressure at which the NEG material becomes effective has been attained, the NEG pump takes over as the primary pumping means and is capable of pumping light contaminants, such as hydrogen, water vapour and other gases at very high pumping speeds, for example in the order of 30,000 liters per second. The beauty of the invention is that the NEG does not pump inert gases such as argon, in which it is often desired to carry out processing at partial pressures in the order of 3 mTorr. When it is desired to carry out processing at an absolute pressure of about $10^{-9}$ Torr, heavy gases, such as argon, can easily be pumped with the small sized turbomolecular pump used to attain the absolute pressure of $10^{-6}$–$10^{-7}$ Torr required for the NEG to become effective. The NEG material only pumps the undesirable light contaminants, such as hydrogen and water vapor, which cannot be pumped with such a pump.

Another advantage of the invention is that due to the ability of the NEG material to pump only the impurities, processing can take place in the presence of stagnant argon. It is no longer necessary to have a continuous flow of argon. This leads to a considerable simplification in the design of the equipment.

In the prior art, an alternative to a very large turbomolecular pump for achieving absolute pressures in the order of $10^{-9}$ Torr (which means removing light gases) was to use a cryogenic pump. This essentially freezes out the contaminants. A cryogenic pump is bulky and must be connected to the vacuum chamber through a conduit, which necessarily has a limited conductance (analogous in the vacuum art to electrical conductance in the electrical art) that limits the pumping speed from the chamber. The invention allows cryogenic pumps to be eliminated entirely.

The apparatus is typically a cluster tool for carrying out various semiconductor processes, such as PVD and/or CVD deposition, wafer transfer etc. It will be understood that when reference is made throughout to a vacuum chamber, any chamber designed to operate under reduced pressure is included. The vacuum chamber may includes an inert gas, such as argon, at low pressures, for example, in the order of 3 mTorr in which the processing takes place.

The non-evaporable gettering material may, for example, be a zirconium-vanadium-iron alloy or a zirconium-aluminum alloy. A suitable material is sold under the designation ST707 from SEAS Getters S.p.A, of Via Gallarate, 215, Milan, Italy. A preferred material is sold under the designation ST172, also by SAES getters. This consists of a porous sintered structure based on a mixture of Zr+St707 alloy.

The contaminants are typically gaseous impurities, such as oxygen, nitrogen, carbon monoxide, hydrogen and water vapor.

By using NEG as a pumping material then, a major revolution in the design of cluster or similar tools is possible. The use of NEG can minimize the need for a sophisticated vacuum load lock; enhance the efficiency of the wafer degas; improve the vacuum by about an order of magnitude; reduce the gaseous impurity levels by about an order of magnitude; reduce the downtime due to the regeneration cycle time and due to the waiting time required in order to achieve ultra-high vacuum; improve the performance/cost of the tools; improve the performance/cost of the existing processes; stabilize the self-diffusion process of aluminum alloys; and permit the integration of PVD and of CVD in one cluster tool so that PVD and CVD can be carried out in the same tool.

Provided it is protected from the atmosphere, the NEG material needs only to be activated periodically, for example, initially to remove oxidation and subsequently when it becomes saturated. Typically, the NEG material is regenerated once per month during normal use. Before the NEG becomes operational, though, the pressure of the vacuum chamber should be reduced below about $10^{-6}$, preferably $10^{-7}$ Torr, something that can be achieved with a modestly sized turbomolecular pump.

The use of non-evaporable getters and the infrared energy liberated during the activation of the NEG improves the design of deposition cluster tools, the deposition process itself, and the reliability of the obtained films. It reduces the particle micro contamination of the obtained films, the system's operational costs, and unscheduled and scheduled downtimes, and simplifies the software. It also reduces the size and amount of use of the clean room, and simplifies the integration of CVD and PVD process modules in deposition cluster tools.

It is particularly advantageous if an NEG pump is used in the transfer chambers because the extremely high pumping speeds offered by NEG substantially eliminates cross contamination without the need for expensive load locks as the workpiece is transferred from one chamber to the next. This arrangement makes feasible CVD and PVD processing in the same cluster tool without bulky and complex pumping and valve equipment.

Indeed, given the very high pumping rate for NEG, which is an order of magnitude higher than achievable with prior art systems, it may even possible under certain circumstances to eliminate the isolation valves entirely between some of the chambers in the cluster tool. This would result in a dramatic improvement in overall processing time. In such an embodiment, a sufficient aperture would be provided in the wall separating a processing chamber from a transfer chamber to allow the wafer to pass while restricting gas flow.

The invention also provides a method of processing a substrate in a controlled environment, comprising the steps of: placing the substance in a chamber in the presence of a non-evaporable gettering material; and subsequently processing the substrate while the non-evaporable gettering material removes contaminants from the chamber.

The non-evaporable gettering material is typically activated by applying heat in a vacuum, for example heating the non-evaporable gettering material to a temperature of about 500° to 700° C. for about 10 to 30 minutes at a pressure of about $10^{-5}$ to $10^{-7}$ Torr. A typical example would be 500° C. for 15 minutes at $10^{-6}$ Torr. The same technique can be used to regenerate the NEG periodically during use. Provided the NEG material is protected against exposure to the atmosphere, activation only needs to take place once and then the material must be regenerated about once per month using the same technique.

BRIEF DESCRIPTION OF THE DRAWINGS

The invention will now be described in more detail, by way of example only, with reference to the accompanying drawings, in which.

DESCRIPTION OF THE PREFERRED EMBODIMENTS

Figure 1:
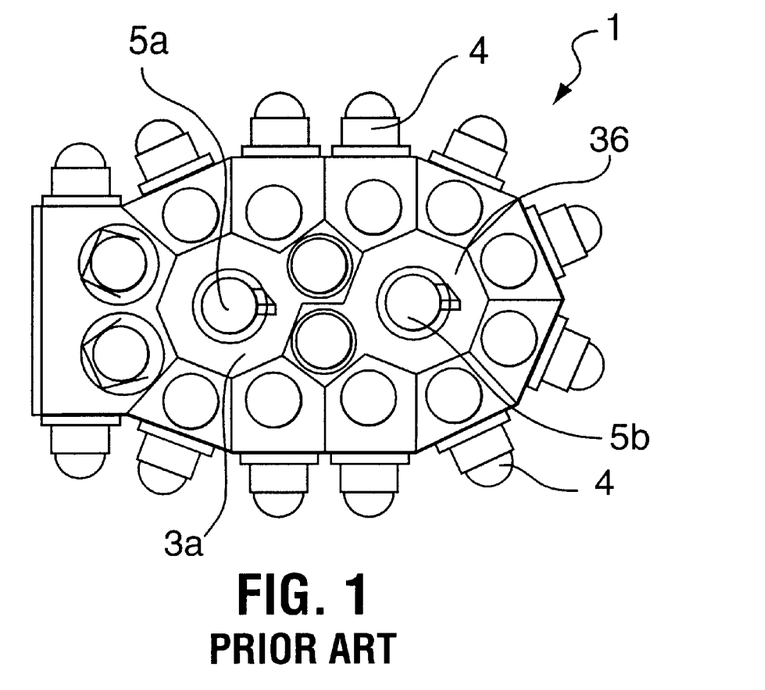
FIG. 1 is a plan view of a prior art cluster tool.

Referring to FIG. 1, a cluster tool 1 for semiconductor processing comprises a plurality of isolated vacuum chambers or modules 2, which include degas modules, cooling modules, etch process modules, PVD process modules, reactive PVD process modules, and CVD process modules. These modules are arranged around the periphery of the cluster tool 1 and isolated from each other. Each module 2 requires a large turbomolecular pump and cryogenic pump 4 to continually remove gaseous impurities, including light gases such as hydrogen and water vapor, during processing. As a result, the cluster tool is large, complicated, and expensive. The cluster tool shown in FIG. 1 could be a Varian M2000/8 tool, for example.

Within the processing modules 2 are the transfer modules 3a, 3b. These include robot manipulators 5 which are capable of transferring the wafers between any of the processing chambers 2. The transfer modules 3a, 3b also include holding locations 6a, 6b where the wafers may be temporarily stored and to permit transfer between the two transfer chambers 3a, 3b. For example, manipulator 5a can pick up one of the cassettes holding a wafer from one of its associated transfer chambers 2, park it at location 6a, where it may be picked up by manipulator 5b.

Transfer modules 3a, 3b also have a heavy duty turbomolecular and cryogenic pump (not shown) communicating therewith. This is necessary to achieve the required pumping rate to prevent cross contamination when the wafers are transferred.

Figure 2:
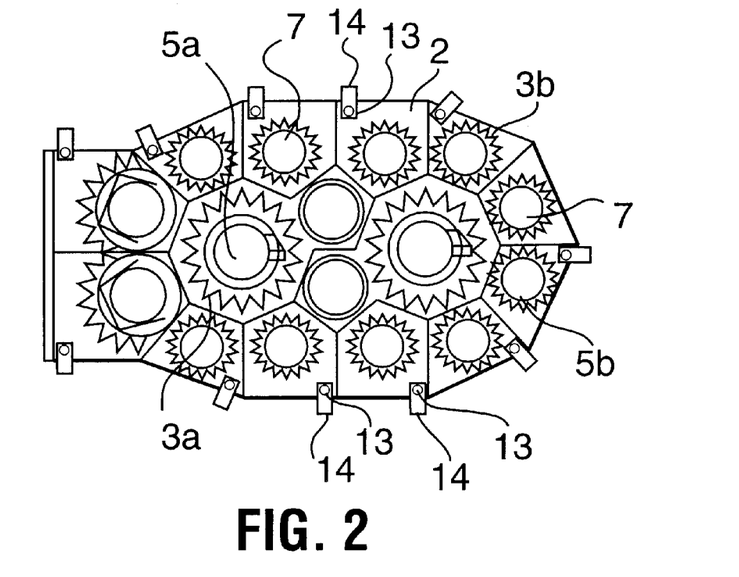
FIG. 2 is a plan view of a cluster tool in accordance with the invention.

In accordance with the invention, as shown in FIG. 2, the large scale turbomolecular and cryogenic pumps 4 are removed and replaced by a small, low cost turbomolecular pump 13, and a pump isolation valve 14. The pump 13 can be small because it does not have to be capable of achieving ultra low absolute pressures. It need only attain partial pressures in the order of $10^{-7}$ Torr for light gases. Such a pump can easily attain partial pressures in the order of $10^{-9}$ Torr for argon.

Each vacuum chamber 2 contains high speed internal pump 12 consisting of a zirconium-vanadium-iron alloy non-evaporable gettering (NEG) material on an accordion-like constantan support. This also serves as a resistive heating element. The NEG material acts as a pump absorbing impurities from the vacuum chamber. The NEG pump entirely eliminates the need for the associated large scale turbomolecular and cryogenic pumps used in existing systems.

The preferred material is an ST-172 alloy sold by SAES Getters S.p.A of Milan Italy referred to above. typical pump 12 is made of sintered ST-172 powder. It uses standard 70 mm long fins with an optimized angle between the fins for maximum surface area. The fins are arranged in a cylindrical design and are about 25 cm high. The apparent surface area is about 7500 $cm^2$, which gives a pumping speed greater than 30,000 l/s throughout the five-year life of NEG.

The NEG material is capable of holding 1500 Torr.l of (30%H2O+30%H2+30%CO+10%O2) at base pressure<1 $E^{-10}$ Torr. It can be activated in a dynamic ambient<1 $E^{-5}$ Torr (60%N2+20%O2+15%H2O+5%H2) at 450° C. temperature for less than 45 minutes duration.

In addition, transfer modules 3a, 3b also have a zirconium-vanadium-iron NEG pump 7 arranged on a constantan support and folded in an accordion-like fashion within the transfer chamber clear of the manipulator. The NEG material is disposed in the transfer chamber in a manner similar to processing chambers 2.

The use of in-situ NEG material acting as an internal pump serving as the primary pumping means inside the degas modules, cooling modules, transfer modules, etch process modules, and PVD process modules makes possible the elimination of most of the large size and expensive cryogenic pumps, and most of the large size and expensive pump isolation valves, and allows them to be replaced by very small size and very cost turbomolecular pumps 13 and pump isolation valves 14. The turbomolecular pumps 13 can be made small and inexpensive because their role is merely to create the initial vacuum to enable the NEG material to become effective.

NEG material 12 needs to be activated once under the high vacuum supplied by the small size turbomolecular pumps 13 at a pressure typically around $10^{-5}$ to $10^{-7}$ Torr), at high temperature (typically around 500° to 700° C., and for a certain duration (typically around 10 to 30 minutes) in order to be able to pump nitrogen, oxygen, carbon monoxide, water vapor, hydrogen and other impurities. A practical example is a temperature of 500° C. for 15 minutes at a pressure of $10^{-6}$ Torr. Once activated the NEG material 12 can pump at a very high rate and at room temperature. This means that after activation of the NEG material, the small size turbomolecular pumps 13 can be isolated by closing the small pump isolation valves and completely stopped.

Provided it is protected from the atmosphere, the NEG material only needs to be activated initially to remove oxidation layers and then periodically, say once per month, to regenerate the material by driving off absorbed gases. It is not necessary to activate or regenerate the NEG material prior to each use of the equipment.

Unlike the prior art where argon was continually removed and replaced to remove impurities, the invention allows the semiconductor processes to be carried out in stagnant argon because the NEG only removes the contaminant gases and does not affect the argon.

Furthermore, since the NEG material can provide extremely high pumping speed, it is possible for the module isolation valves of the cooling modules, the transfer modules, the etch process modules, and the PVD process modules to remain open all the time. This requires a common pressure of stagnant argon throughout the equipment, which is under continuous in-situ purification by the NEG material that is simultaneously used for cooling, transfer, etching and PVD.

Figure 3:
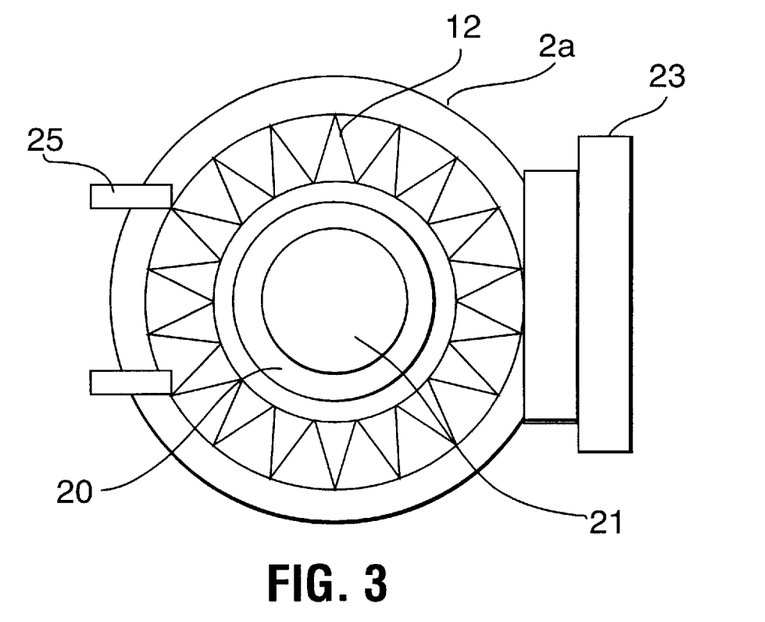
FIG. 3 is a plan view of a vacuum chamber including an NEG pump in accordance with the invention.
Figure 4:
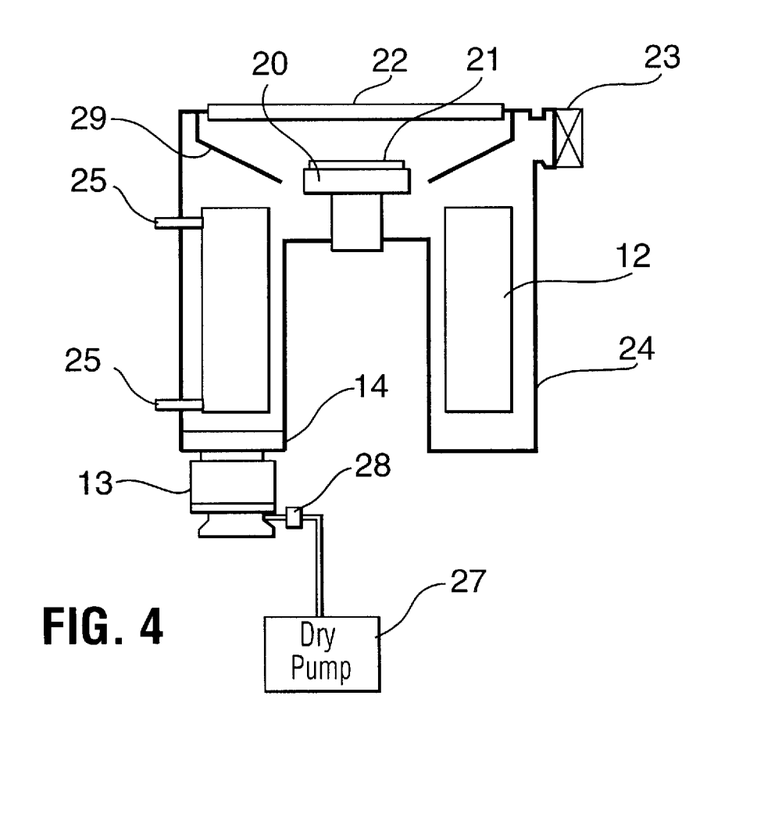
FIG. 4 is a schematic sectional view of a physical vapor deposition chamber in accordance with the invention.

Referring now to FIGS. 2 and 3, the vacuum chamber 2a is of conventional shape and includes a semiconductor wafer support 20 on which is placed a semiconductor wafer 21 that is to be processed. Above the wafer 21 is a conventional PVD target 22. The wafer 21 is transferred to the chamber through isolation valve 23.

The NEG material 12 comprises a ring of particulate zirconium-vanadium-iron alloy formed on a constantan support folded accordion style and located mainly in an annular cavity forming part of the chamber 2a extending down from the main part of the cavity containing the support 20. This arrangement maximizes the exposed surface area of the support.

Electrical terminals 25 allow a 24 Volt AC or DC supply to be connected to the constantan for activation purposes. A high current, in the order of a few hundred amps is passed through the constantan support to heat it to the desired temperature. This can conveniently be achieved by applying a low AC or DC voltage (typically less than 24 volts), high current (typically of a few hundreds of amperes) power supply. This low voltage and high current power can be obtained, either from a high current step-down AC transformer or, preferably, from a series-parallel combination of DC car batteries. Alternatively, infrared heaters or other forms of heating device can be employed.

A small size turbomolecular pump 13 and dry pump 27, connected to the turbomolecular pump through valve 28, allow the pressure to be brought down to about $10^{-6}$ Torr for activation of the NEG pump 12.

Protection shields 29 protect the NEG pump 12 from the PVD target so that the PVD material is not deposited on the surface of the NEG pump during processing.

The use of the module isolation valves and large size cryogenic pumps is then limited to reactive PVD process modules and to CVD process modules.

As mentioned above, the NEG material 12 can be a commercial material sold under the designation ST-707 from SAES Getters (Milan, Italy). This is a zirconium-vanadium-iron alloy in the form of small particles (about 70 $\mu$m in size, which is bonded onto a 0.2 mm thick constantan support of variable width and length. The constantan support is folded on itself accordion fashion as a zigzag array of fins of optimum spacing to increase the effective surface area and to increase the net pumping speed. The currently preferred material, however, is ST-172.

As an example, a twelve inch high foil can be folded so as to form a donut-shaped cylinder having a 330 mm inside diameter and a 380 mm outside diameter. This fits a typical size PVD process module and gives, at room temperature, an approximate pumping speed of about 25,000 liter/sec for hydrogen, 20,000 l/s for water vapor, 15,000 l/s for Oxygen, 8000 l/s for carbon monoxide, and 3,000 l/s for nitrogen. When compared to the pumping speed of the typically used large size cryogenic pumps, these pumping speeds are about 100 times faster for hydrogen, and about 10 times faster for the other impurities.

The transfer modules can accommodate a much larger NEG pump with a much larger pumping speed of the order of 100,000 l/s. This is highly advantageous because the very high pumping speed means that it is possible to transfer wafers directly from the processing chambers 2 without having to open isolation valves. The pumping rate is so high that any contaminants coming form the communicating processing chambers can be immediately removed.

The ST-707 NEG material may be activated at about 500° C. for about 15 minutes under high vacuum of about $10^{-6}$ Torr, using the small size turbomolecular pump 13. As indicated above, this activation only needs to be carried out initially and then periodically as the NEG material becomes saturated.

A series of low voltage/high current vacuum lead-throughs are required to connect the in-sit NEG to the external power supply. This connection is only necessary during the activation of the NEG.

The activation of the NEG can be done at about $10^{-6}$ Torr during the pump-down cycle of the vacuum chamber using the turbomolecular pump assisted by a dry pump. Since the activation usually takes about 15 to 20 minutes, it does not make any extra contribution to the downtime of the system.

The first time the NEG material is activated, it is covered with an oxidation layer and other contaminants that are driven off during the activation process. During subsequent cycles, the activation serves to drive off the absorbed impurities and effectively regenerate the NEG.

The use of NEG as a highly efficient pump eliminates cross contamination between different processing chambers by permitting an extremely high pumping speed (in the order of 100,000 l/s for moisture) in the transfer module. This minimizes the need for an expensive vacuum load lock since it will more efficiently isolate the transfer module and the deposition modules from the ambient air. It also provides a simple and low cost design for the vacuum load locks, the cooling modules, and the transfer modules.

The wafer degassing is improved by using a very high pumping speed NEG (in the order of 40,000 l/s pumping speed for moisture) around the degas modules pumped with a turbomolecular pump in order to very efficiently remove any trace of gaseous impurities trapped in the wafers' porous surface.

The use of NEG (with a pumping speed in the order of 20,000 l/s for moisture) also improves the etch process modules, the PVD process modules, and particularly the aluminum self diffusion process due to the reduction in the gaseous contamination levels without the need for expensive ultra-high vacuum components. The improved pumping speed for hydrogen will also ensure better base pressure.

Since NEG material forms an in-situ pump, the pumping speed of is no longer limited by the leakage of the connecting flange to the vacuum chamber since no such flange, unlike the case for a cryogenic pump, is required. In fact, the pumping speed can be optimized by maximizing the contact area of the getter material to the vacuum. Pumping speeds in the order of 20,000 to 100,000 l/s constitute a first advantage of NEG over traditional pumps. This translates into lower scheduled downtime because of shorter wait times after opening the module to air. NEG activates in about 15 minutes while cryogenic pumps require about three to four hours to regenerate.

The NEG ability to pump at room temperature without electricity and without vibration is a second advantage over traditional cryogenic pumps and turbomolecular pumps. Because NEG does not pump inert gases, it does not load itself during etch processes nor during deposition processes in inert gases. This advantage means less frequent regeneration, shorter regeneration cycle time, and lower downtime.

Since the pressure of the area around the degas module, the pressure in the transfer module, the etching pressure in the etch module, the process pressure in the PVD process module, and the cooling pressure in the cooling module can all be fixed at the same value, say of 3 mTorr, the NEG can take care of the in-situ purification of this 3 mTorr of stagnant argon and eliminate the need for frequent gas cycling, for valve openings, etc. This advantage reduces particle micro contamination, increases throughput simplifies the system's software, increases reliability by reducing unscheduled downtime, and reduces overall cost.

Figure 5:
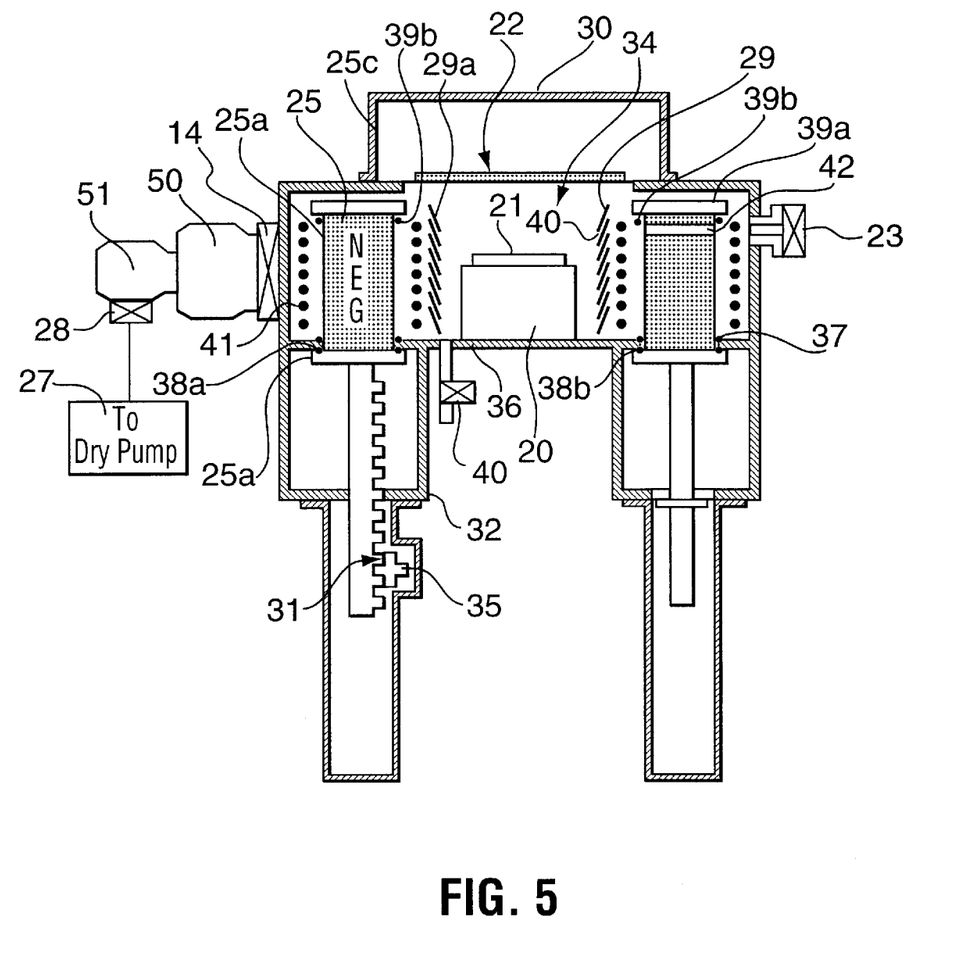
FIG. 5 is a more detailed sectional view of a deposition chamber employing an NEG pump.

One of the characteristics of non-evaporable getter material (NEG) is that if exposed to air it loses its gettering properties. It is necessary to expose the deposition chamber to air from time to time, for example, to replace the target, and some means is required to prevent the NEG material being exposed to the atmosphere when the chamber is opened. FIG. 5 shows a preferred construction of a PVD module that addresses this need.

In FIG. 5, a wafer 21 is located on a support 20, which serves as a backside heater, in deposition chamber 34. Target 22 is mounted over the wafer 21 in the deposition chamber. A removable cap 30 is located over the target 22 to allow the chamber 34 to be opened for access, for example, to permit the target 22 to be removed.

A tandem arrangement of turbomolecular pumps 50, 51 connected through valve 28 to dry pump serves to create the initial vacuum of about $10^{-5}$ Torr prior to introduction of the NEG pump 25. Pump 50 is a V550 turbopump and pump 51 is a V70LP turbopump.

The donut or ring-shaped NEG pump 25 normally surrounds the wafer 21 and support 20, providing a wafer heater. The pump is mounted on a ratchet mechanism 31 extending into a sealed cylindrical antechamber 32 below main deposition chamber 34. The ratchet mechanism includes a pawl 35, which allows the NEG pump to be raised into the operative position shown and withdrawn into a retracted position within the antechamber 32. The pawl 35 can be turned by hand or by a small electric motor. Alternatively, any suitable raising and lowering means can be employed.

The bottom wall 36 of the deposition chamber 34 has a circular aperture 37 accommodating the cylindrical getter pump 25. The cylindrical pump 25 has a slightly recessed body portion 25a so as to form an upper lip 25c and a lower lip 25d.

Pairs of O-rings 38a, 38b, and 39a, 39b are provided on the NEG pump 25 respectively above the lower and below the upper lips 25d, 25c.

In the raised position shown the O-rings 38a, 38b seal against lower surface of the bottom wall of the chamber 34. In the retracted position (not shown) the O-rings 39a, 39b seal against the upper surface of the bottom wall of the chamber 34.

The protection shield 29 includes a plurality of baffle plates 29a extending to the bottom wall 36 so as to completely shield the wafer 21 and support 20. A slit 40 is formed in the baffle plates 29a and a slit 41 is formed in the NEG pump 25 to allow the wafers to pass therethrough en route to the isolation valve 23 (and vice versa).

The bottom wall 36 also includes a gas inlet valve for the admission of argon to the deposition chamber 34.

The ring-shaped getter pump 25 is surrounded by a stack of infrared lamps 41 for heating the getter material 25 for the purpose of activation or regeneration. Infrared lamps are preferred to the constantin support described with reference to the previous embodiment.

In normal operation, the NEG pump 25 is in the raised position shown. The infrared lamps 41 are operated for the purpose of activating or regenerating the NEG material 25. They can also be used to heat the NEG material during wafer processing because the pumping speed increases significantly with temperature. It is desirable to operate the NEG pump 25 at a temperature of about 280° C.

When it is desired to open the deposition chamber 34, for example, to replace the target 22, the NEG pump is withdrawn into the antechamber 33 and sealed with the aid of seals 38a, 38b. A vacuum is maintained in antechamber 33, which is temporarily in communication with the main deposition chamber 34 in the intermediate positions of the NEG pump 25. The NEG material is thus not exposed to the atmosphere while the deposition chamber 34 is open.

The infrared lamps 41 can also serve the dual purpose of baking the walls of the deposition chamber to drive off absorbed gases for regeneration purposes.

Wafer processing can take place either in static argon or dynamic argon, in which latter case the argon is continually supplied through inlet valve 40 and withdrawn through turbomolecular pump 13. If processing takes place in static argon, an electrostatic chuck should be used to prevent consumption of the NEG pump by residual impurities from the backside argon gas. In either case the NEG pump 25 continually removes impurities.

In the FIG. 5 embodiment, the NEG pump 25 is made from a sintered mass of ST-172 NEG material shaped in an array of 240 (25 cm×5 cm) fins distributed over a cylinder 25 cms high and having an outside diameter of 45 cms with a total surface area of 60,000 cm$^2$.

The infrared lamps are used to activate the NEG pump at 450° C. for 45 minutes at 10$^{-5}$ Torr and hold the NEG pump at 200° C. for normal operation.

The V550/V70LP tandem turbopump configuration can be used to prevent gas backstreaming from the drypump and maintain a pressure lower than about 10$^{-10}$ Torr.

In a cluster tool embodying the invention, the use of the isolation valve of the process modules can be limited to module maintenance, to the reactive PVD process module (which uses nitrogen or any other NEG pumpable gas), and to CVD process modules. In these two last cases, a turbomolecular pump or cryogenic pump are used to pump the reactive gas to low partial pressures and to re-establish the 3 mTorr of relatively pure argon which permits the isolation valve to be opened for wafer transfer through the transfer module.

The use of an NEG pump thus offers an improved metallization process and, particularly, an improved aluminum self-diffusion process due to an important reduction of residual gaseous impurities; a significant reduction in the levels of impurities which are known to degrade the resistance of aluminum alloys to electromigration and to stress voiding, thus resulting in an improved aluminum film resistance against electromigration and stress voiding; a significant reduction in particle micro contamination by allowing processing in stagnant argon (which eliminates the need for cycling gas valves) by limiting the closure of the isolation valves to maintenance situations, to the reactive PVD and CVD process modules; and by replacing the large vibrating cryogenic pumps and their large compressors with small turbomolecular pumps which only operate during the pump-down of the process module to base pressure; a major reduction in the system's cost by the elimination of the Cryogenic pumps due to the elimination of most of the sophisticated ultra-high vacuum components by the replacement of the in-situ ultraviolet lamps, of the in-situ infrared lamps, as well as of the ex-situ heaters by the in-situ NEG provides infrared radiation and internal heating during the activation phase; by the simplification of the gas distribution systems; and by the reduction of spare components resulting from a major simplification of the design.

A significant reduction in the scheduled downtime results from a reduction of the waiting time to achieve ultra-high vacuum from 12 hours to about 90 minutes, and by eliminating the need for Cryogenic pump regeneration associated with the hydrogen pumping speed problem, which limits the base pressure of the module to the order of E$^{-9}$ Torr.

A significant reduction of unscheduled downtime results from the elimination of most sophisticated components. Also, the software can be simplified because not so many components need to be controlled. There is also a major reduction in the size of the system and in the use of clean room area.

Of course, NEG materials other than SAES ST-707 or ST-172 can be employed. One alternative material employs a vanadium-aluminum alloy.

Other activation techniques can be employed. For example, instead of using Joule heating, the NEG material can be heated with infrared.

The invention is of course not restricted to deposition cluster tools, but is applicable to any process where a substrate must be treated in a vacuum or inert environment.

It should be obvious that the above described embodiments are merely illustrative of the application and of the principles of the present invention, and numerous modifications thereof may be devised by those skilled in the art without departing from the spirit and scope of the invention.

We claim:

1. An apparatus for processing a substrate, comprising:
   a closed processing chamber for providing a controlled environment, said closed processing chamber being openable to an atmosphere for access thereto;
   a support in said closed chamber for the substrate to be processed;
   an external pump communicating with said closed chamber and capable of attaining an initial absolute pressure in said chamber of about 10$^{-6}$ to 10$^{-7}$ Torr;
   an isolation valve that isolates said external pump from said chamber during processing;
   an in-situ non-evaporable gettering material providing an internal pump with a pumping speed of at least 20,000 liters/sec for moisture located in said closed chamber adjacent said support, said non-evaporable gettering material serving as an internal pump acting as the primary pumping means for maintaining a vacuum and removing contaminants from said controlled environment during processing without the assistance of a cryopump;

an antechamber communicating with said closed processing chamber for protecting said non-evaporable gettering material from the atmosphere when said closed processing chamber is opened to the environment; and f) a retractable support on which said non-evaporable gettering material is mounted, said retractable support being arranged so that it can be withdrawn from said closed processing chamber into said antechamber and sealed therein to permit said at least one closed processing chamber to be opened without exposing the non-evaporable gettering material to the atmosphere.

2. An apparatus as claimed in claim 1, further comprising a heat source for activating and regenerating said non-evaporable gettering material.

3. An apparatus as claimed in claim 2, further comprising electrical terminals for connection to a power supply, said electrical terminals being connected to a resistive element providing said heat source and serving as a support for said internal pump.

4. An apparatus as claimed in claim 3, wherein said support is folded in an accordion fashion to increase the net surface area thereof.

5. An apparatus as claimed in claim 1, wherein said non-evaporable gettering material is a zirconium-vanadium-iron alloy.

6. An apparatus as claimed in claim 1, wherein said zirconium-vanadium-iron alloy is in the form of small particles bonded onto a support of variable width and length.

7. An apparatus as claimed in claim 1, wherein said closed processing chamber contains a stagnant inert gas.

8. An apparatus as claimed in claim 7, wherein said inert gas is argon.

9. An apparatus as claimed in claim 1, wherein said closed chamber is a vacuum deposition chamber and a shield is provided over said non-evaporable gettering material to protect it from material to be deposited.

10. An apparatus as claimed in claim 1, wherein said chamber is a transfer chamber.

11. An apparatus for the vapor deposition of a substance onto a substrate, comprising:

a) at least one vacuum chamber for containing the substrate;

b) an external pump communicating with said closed chamber and capable of attaining an initial absolute pressure in said chamber of about $10^{-6}$ to $10^{-7}$ Torr;

c) a support in said at least one vacuum chamber for said substrate:

d) a source of said substance to be deposited;

e) an isolation valve that isolates said external pump from said chamber during processing;

f) an in-situ non-evaporable gettering material providing a pumping speed of at least 20,000 liters/sec for moisture located in said closed chamber adjacent said support, said non-evaporable gettering material serving as an internal pump acting as the primary pumping means for maintaining a vacuum and removing contaminants from said controlled environment during processing without the assistance of a cryopump;

g) an antechamber communicating with said at least one vacuum chamber for protecting said non-evaporable gettering material from an atmosphere when said vacuum chamber is open to the atmosphere; and f) a retractable support on which said non-evaporable gettering material is mounted, said retractable support being arranged so that it can be withdrawn from said at least one vacuum chamber into said antechamber and sealed therein to permit said at least one vacuum chamber to be opened without exposing the non-evaporable gettering material to the atmosphere.

12. An apparatus as claimed in claim 11, wherein said external pump is a turbomolecular pump.

13. An apparatus as claimed in claim 11, further comprising means for regenerating said non-evaporable gettering material.

14. An apparatus as claimed in claim 13, wherein said means for regenerating said non-evaporable gettering material comprise a resistive support for said non-evaporable material acting as a heating means.

15. An apparatus as claimed in claim 11, wherein said non-evaporable gettering material is a zirconium-vanadium-iron alloy.

16. An apparatus as claimed in claim 15, wherein said zirconium-vanadium-iron alloy is in the form of particles bonded onto a support of variable width and length.

17. An apparatus as claimed in claim 16, wherein said support of variable width and length comprises an array of fins folded accordion fashion to maximize the exposed surface area of said non-evaporable gettering material.

18. An apparatus as claimed in claim 11, further comprising a plurality of said chambers in communication with each other.

19. An apparatus as claimed in claim 18, wherein at least one of said chambers is a transfer chamber and another of said chambers is a vapor deposition chamber.

20. An apparatus as claimed in claim 11, wherein said closed chamber contains stagnant inert gas.

21. An apparatus as claimed in claim 20, wherein said inert gas is argon.

22. Wafer processing apparatus comprising:

a) at least one vacuum chamber for containing the wafer;

b) an external pump for creating at least an initial vacuum in said chamber;

c) a support for said wafer;

d) an internal pump located in said chamber serving as the primary pumping means for maintaining a desired vacuum and removing contaminants during processing, said internal pump comprising a non-evaporable gettering material;

e) an antechamber communicating with said at least one vacuum chamber for protecting said non-evaporable gettering material from an atmosphere when said vacuum chamber is open to the atmosphere; and f) a retractable support on which said non-evaporable gettering material is mounted, said retractable support being arranged so that it can be withdrawn from said at least one vacuum chamber into said antechamber and sealed therein to permit said at least one vacuum chamber to be opened without exposing the non-evaporable gettering material to the atmosphere.

23. Wafer processing apparatus as claimed in claim 22, wherein said retractable support includes a ratchet and pawl mechanism to permit the retraction and extension thereof.

24. Wafer processing apparatus as claimed in claim 22, wherein said non-evaporable gettering material is shaped in the form of a cylinder with upper and lower lips, said non-evaporable gettering material extends through an aperture in a wall of said at least one chamber, and said upper and lower lips engage said wall to seal said antechamber from said at least one vacuum chamber in respective retracted and extended positions of the retractable support.

25. Wafer processing apparatus as claimed in claim 24, further comprising a cylindrical array of heaters surrounding said non-evaporable gettering material.

26. Wafer processing apparatus as claimed in claim 25, wherein said heaters are infrared heaters.

27. Wafer processing apparatus as claimed in claim 22, further comprising an array of baffle plates between said non-evaporable gettering material and said support to shield said wafer.

28. Wafer processing apparatus as claimed in claim 27, further comprising a slit formed in said non-evaporable gettering material through which wafers can pass to enter and exit said at least one vacuum chamber.

* * * * *